United States Patent
Han et al.

(10) Patent No.: US 10,381,839 B2
(45) Date of Patent: Aug. 13, 2019

(54) PHOTOVOLTAIC MODULE

(71) Applicant: LG ELECTRONICS INC., Seoul (KR)

(72) Inventors: Dongho Han, Seoul (KR); Giyob Park, Seoul (KR); Myonghwan Kim, Seoul (KR); Yunsu Bae, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 133 days.

(21) Appl. No.: 15/459,350

(22) Filed: Mar. 15, 2017

(65) Prior Publication Data
US 2017/0271876 A1    Sep. 21, 2017

(30) Foreign Application Priority Data

Mar. 15, 2016 (KR) .......................... 10-2016-0031043

(51) Int. Cl.
*H02J 3/38*    (2006.01)
*H02J 3/46*    (2006.01)
(Continued)

(52) U.S. Cl.
CPC .......... *H02J 3/383* (2013.01); *H01L 31/0201* (2013.01); *H01L 31/0481* (2013.01);
(Continued)

(58) Field of Classification Search
CPC .. H02J 3/383; H02J 3/46; H02S 40/32; H02S 50/00; H01L 31/0201
See application file for complete search history.

(56) References Cited

U.S. PATENT DOCUMENTS

2009/0217965 A1    9/2009  Dougal et al.
2011/0031816 A1    2/2011  Buthker et al.
(Continued)

FOREIGN PATENT DOCUMENTS

JP    2000-174317 A    6/2000
JP    2012-512532 A    5/2012
(Continued)

OTHER PUBLICATIONS

Goud et al., "GMPPT of Solar PV Array under Partial Shading Condition using LabVIEW FPGA," IECON2015—41st Annual Conference of the IEEE Industrial Electronics Society, IEEE, Nov. 9-12, 2015, pp. 3411-3416, XP032855765.

*Primary Examiner* — Jared Fureman
*Assistant Examiner* — Duc M Pham
(74) *Attorney, Agent, or Firm* — Birch, Stewart, Kolasch & Birch, LLP

(57) ABSTRACT

A photovoltaic module includes a solar cell module including multiple solar cells, and first and second conductive lines connected respectively to first and second solar cells among the solar cells, and a junction box attached to the solar cell module. The junction box includes a power conversion unit including a capacitor unit located between the first and second conductive lines, a converter unit to change the level of a DC voltage at opposite ends of the capacitor unit and to output the DC voltage, and a controller to control the converter unit. When shading occurs in some of the solar cells, the power conversion unit supplies a second current, the level of which is lower than the level of a first current supplied before shading occurs, whereby the possibility of generation of a hot spot may be reduced despite the absence of bypass diodes when shading occurs.

18 Claims, 16 Drawing Sheets

(51) Int. Cl.
*H01L 31/02* (2006.01)
*H02M 3/335* (2006.01)
*H02S 40/32* (2014.01)
*H02S 40/34* (2014.01)
*H02S 50/00* (2014.01)
*H01L 31/048* (2014.01)

(52) U.S. Cl.
CPC .......... *H01L 31/0488* (2013.01); *H02J 3/385* (2013.01); *H02J 3/46* (2013.01); *H02M 3/33507* (2013.01); *H02S 40/32* (2014.12); *H02S 40/34* (2014.12); *H02S 50/00* (2013.01); *Y02E 10/58* (2013.01)

(56) References Cited

U.S. PATENT DOCUMENTS

| | | | |
|---|---|---|---|
| 2012/0215372 A1 | 8/2012 | Kernahan et al. | |
| 2012/0262948 A1* | 10/2012 | Lee | H02S 40/32 363/16 |
| 2012/0262949 A1* | 10/2012 | Han | H02J 3/385 363/16 |
| 2012/0268087 A1* | 10/2012 | Kernahan | H01L 31/02021 323/234 |
| 2013/0193775 A1* | 8/2013 | Lee | H02J 5/00 307/151 |

FOREIGN PATENT DOCUMENTS

| | | |
|---|---|---|
| JP | 2013-33365 A | 2/2013 |
| JP | 2015-521460 A | 7/2015 |
| JP | 2015-156791 A | 8/2015 |
| JP | 2015-197870 A | 11/2015 |
| KR | 10-2012-0134810 A | 12/2012 |
| KR | 10-2013-0027900 A | 3/2013 |
| KR | 10-2015-0036356 A | 4/2015 |
| WO | WO 95/33283 A1 | 12/1995 |
| WO | WO 2010/031614 A1 | 3/2010 |
| WO | WO 2012/081116 A1 | 6/2012 |

* cited by examiner

PHOTOVOLTAIC MODULE

CROSS-REFERENCE TO RELATED APPLICATION

This application claims the priority benefit of Korean Patent Application No. 10-2016-0031043, filed on Mar. 15, 2016 in the Korean Intellectual Property Office, the disclosure of which is incorporated herein by reference.

BACKGROUND OF THE INVENTION

Field of the Invention

Embodiments of the present invention relate to a photovoltaic module, and more particularly, to a photovoltaic module, which may reduce the possibility of generation of a hot spot even if no bypass diodes are provided when shading occurs.

Description of the Related Art

Recently, due to depletion of existing energy resources, such as oil and coal, interest in alternative sources of energy to replace the existing energy resources is increasing. Most of all, solar cells are popular next generation cells to convert sunlight into electrical energy. Meanwhile, a photovoltaic module refers to a configuration in which solar cells for photovoltaic power generation are interconnected in series or in parallel.

SUMMARY OF THE INVENTION

Therefore, the embodiments of the present invention have been made in view of the above problems, and it is an object of the embodiments of the present invention to provide a photovoltaic module, which may reduce the possibility of generation of a hot spot even if no bypass diodes are provided when shading occurs.

According to one aspect of the present invention, the above and other objects can be accomplished by the provision of a photovoltaic module having a solar cell module including a plurality of solar cells, a first conductive line connected to a first solar cell among the plurality of solar cells, and a second conductive line connected to a second solar cell among the plurality of solar cells, and a junction box attached to a back surface of the solar cell module, wherein the junction box includes a power conversion unit having a capacitor unit located between the first conductive line and the second conductive line, and wherein, when shading occurs in some of the plurality of solar cells, the power conversion unit supplies a second current, a level of which is lower than a level of a first current that was supplied before the shading occurs, without bypass for at least one of the first conductive line and the second conductive line.

According to another aspect of the present invention, there is provided a photovoltaic module including a solar cell module having a plurality of solar cells, a first conductive line connected to a first solar cell among the plurality of solar cells, and a second conductive line connected to a second solar cell among the plurality of solar cells, and a junction box attached to a back surface of the solar cell module, wherein the junction box includes a power conversion unit, which includes a capacitor unit located between the first conductive line and the second conductive line, a converter unit to change a level of a DC voltage at opposite ends of the capacitor unit and to output the level-changed DC voltage, and a controller to control the converter unit, and wherein, when shading occurs in some of the plurality of solar cells, the power conversion unit supplies a second current, a level of which is lower than a level of a first current that was supplied before the shading occurs.

According to a further aspect of the present invention, there is provided a photovoltaic module including a solar cell module including a plurality of solar cells, a first conductive line connected to a first solar cell among the plurality of solar cells, and a second conductive line connected to a second solar cell among the plurality of solar cells, and a junction box attached to a back surface of the solar cell module, wherein the junction box includes a power conversion unit, which includes a capacitor unit located between the first conductive line and the second conductive line, a converter unit to change a level of a DC voltage at opposite ends of the capacitor unit and to output the level-changed DC voltage, an inverter unit to convert the level-changed DC voltage into an AC voltage and to output the AC voltage, and a controller to control the converter unit and the inverter unit, and wherein, when shading occurs in some of the plurality of solar cells, the power conversion unit supplies a second current, a level of which is lower than a level of a first current that was supplied before the shading occurs.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Reference will now be made in detail to the embodiments of the present invention, examples of which are illustrated in the accompanying drawings.

With respect to constituent elements used in the following description, suffixes "module" and "unit" are given or alternated with each other only in consideration of ease in the preparation of the specification, and do not have or serve as different meanings. Accordingly, the suffixes "module" and "unit" may be alternated with each other.

Figure 1:
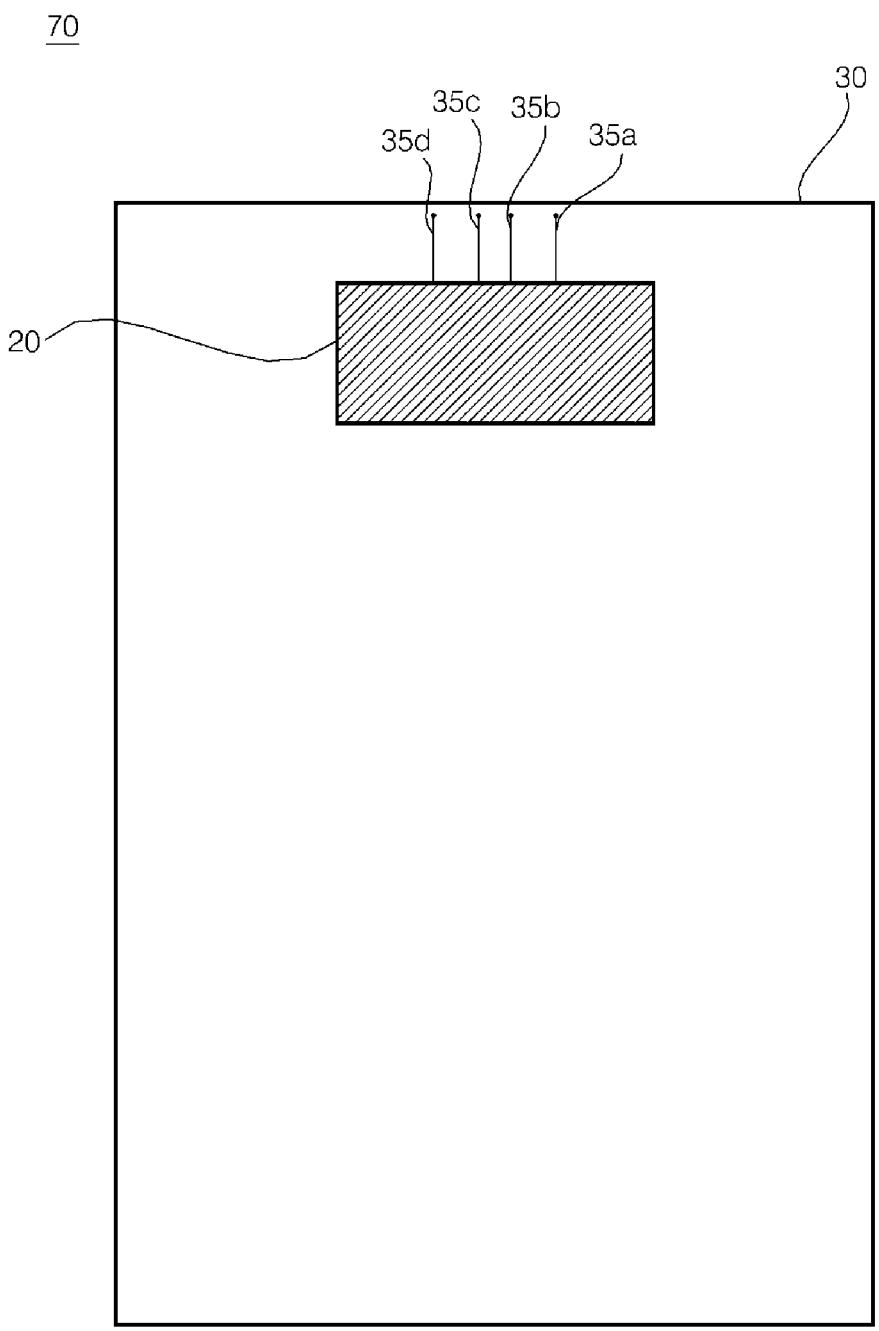
FIGS. 1 and 2 are views illustrating a photovoltaic module.
Figure 2:
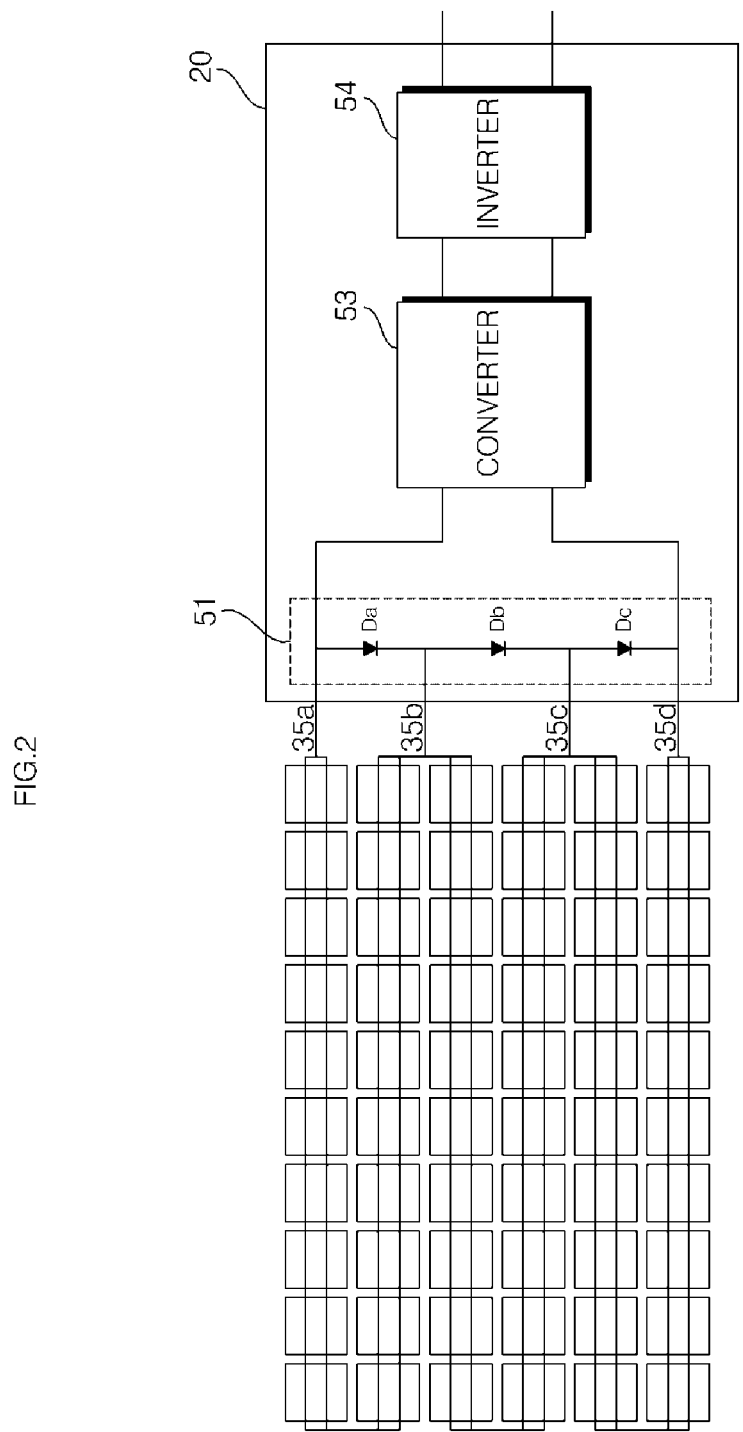

FIGS. 1 and 2 are views illustrating a photovoltaic module.

Referring to FIGS. 1 and 2, the photovoltaic module, designated by reference numeral 70, may include a solar cell module 30 having a plurality of solar cells, four conductive lines 35a to 35d connected respectively to four solar cell strings, bypass diodes Da, Db and Dc connected respectively between the four conductive lines 35a to 35d, a converter 53, and an inverter 54.

When shading occurs in some of the solar cells in the solar cell module 30, at least some of the bypass diodes Da, Db and Dc may be turned on, in order to prevent the generation of a hot spot.

That is, at least some of the four conductive lines 35a to 35d are bypassed, which causes no DC voltage to be supplied from some conductive lines.

Meanwhile, in the instance of the photovoltaic module 70 illustrated in FIGS. 1 and 2, even if shading occurs in some solar cells of any one solar cell string, the bypass diode connected to the corresponding string is turned on so that no DC voltage is supplied from the entire string, which remarkably reduces supply power, compared to power to be generated.

In addition, due to the use of the bypass diodes, for example, manufacturing costs are increased, and the replacement of the entire photovoltaic module 70 is required when the bypass diodes break down, which is inconvenient.

Therefore, the present invention proposes a photovoltaic module, which includes no bypass diodes, but prevents the generation of a hot spot when shading occurs. This will be described below with reference to FIG. 3.

Figure 3:
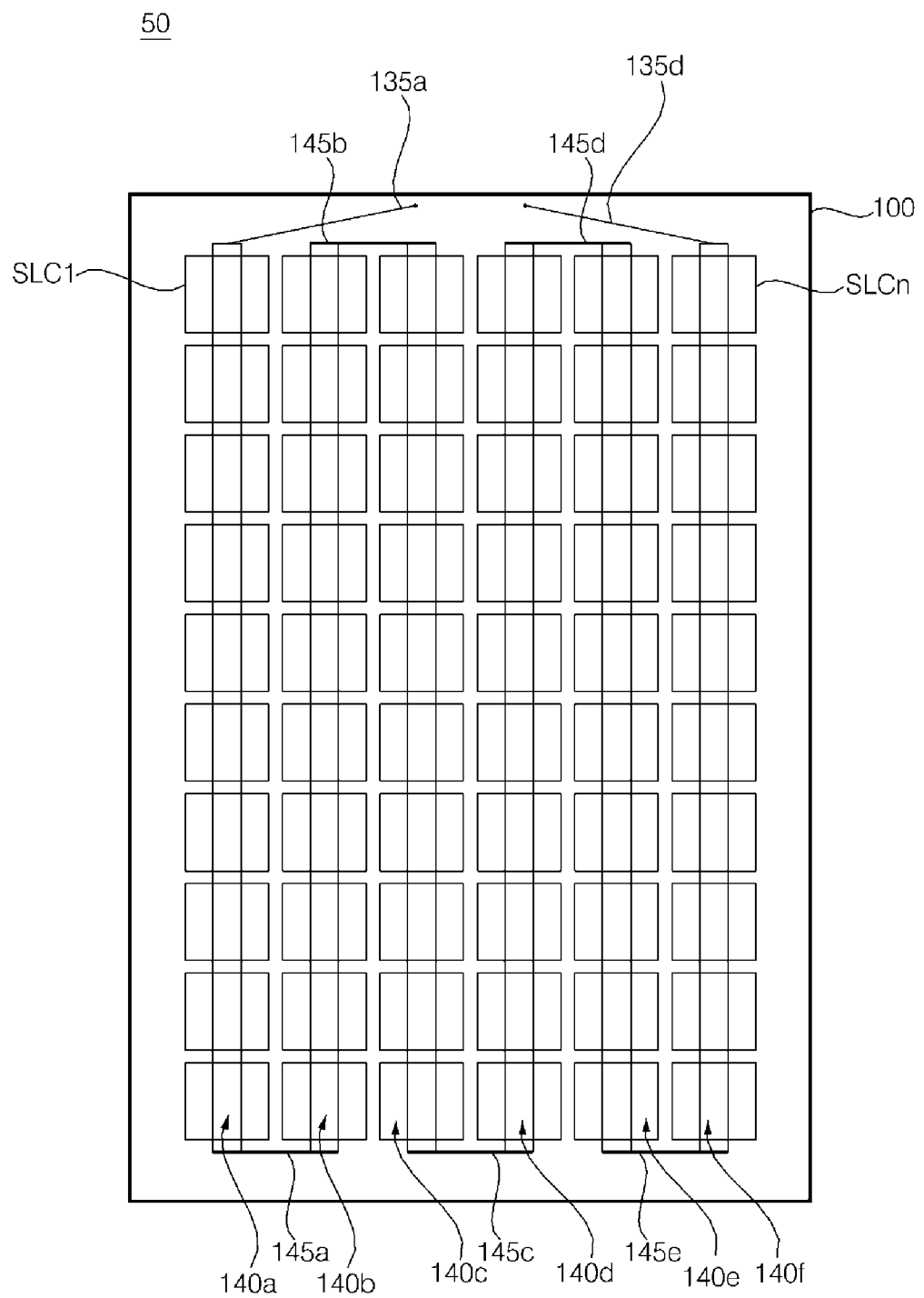
FIG. 3 is a front view of a photovoltaic module according to an embodiment of the present invention.
Figure 4:
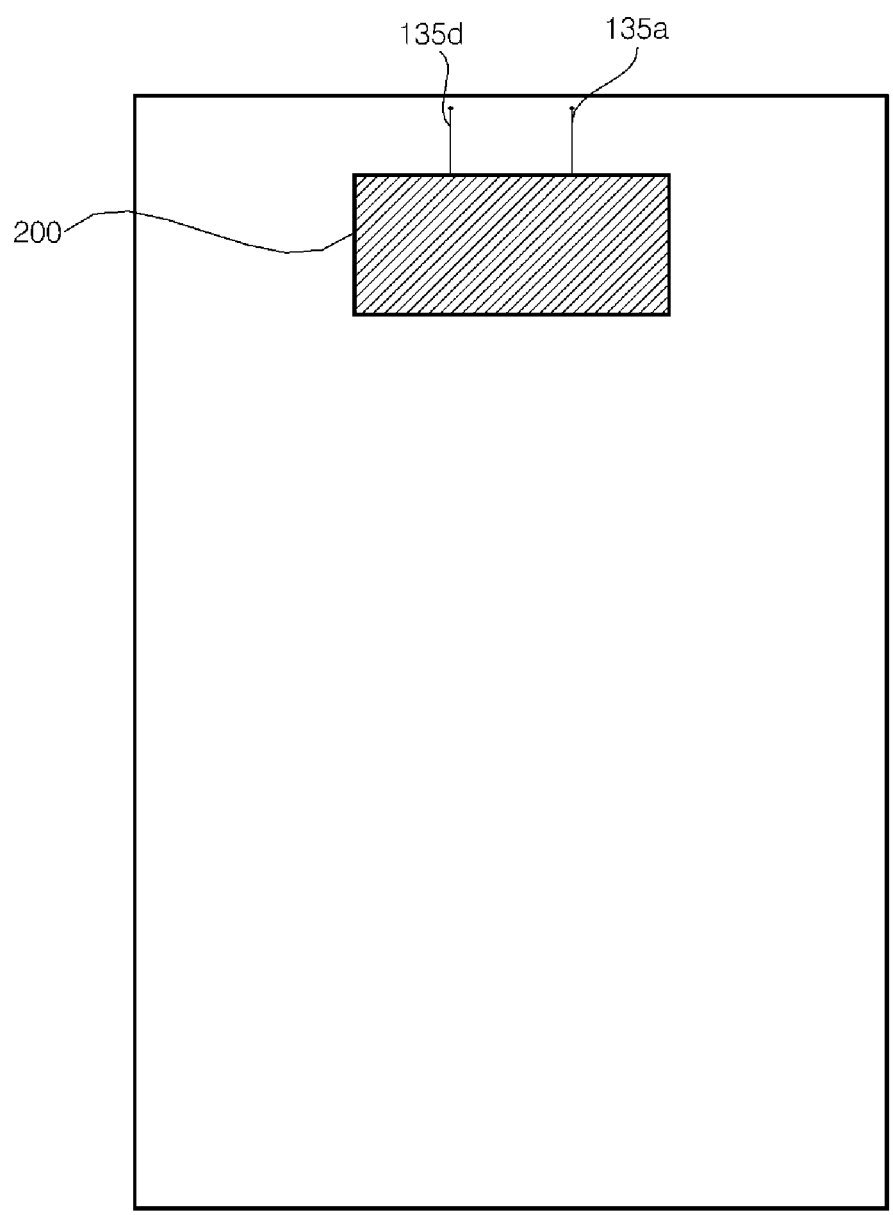
FIG. 4 is a rear view of the photovoltaic module of FIG. 3.

FIG. 3 is a front view of a photovoltaic module according to an embodiment of the present invention, and FIG. 4 is a rear view of the photovoltaic module of FIG. 3.

Referring to FIGS. 3 and 4, the photovoltaic module, designated by reference numeral 50, according to the embodiment of the present invention may include a solar cell module 100 and a junction box 200 located on the back surface of the solar cell module 100.

In the junction box 200, a power conversion unit (see reference numeral 500a in FIG. 5, 500b in FIG. 6, or 500c in FIG. 7) may be provided in order to convert a DC voltage supplied from the solar cell module 100.

The solar cell module 100 may include a plurality of solar cells SLC1, ... SLCn, a first conductive line 135a connected to the first solar cell SLC1 among the solar cells, and a second conductive line 135d connected to the second solar cell SLCn among the solar cells.

The solar cells SLC1, ... SLCn may be interconnected in series, or in a series-parallel combination. FIG. 3 illustrates 60 solar cells interconnected in series.

Among the solar cells SLC1, ... SLCn interconnected in series, the first solar cell SLC1 may be connected to the first conductive line 135a, and the last solar cell SLCn may be connected to the second conductive line 135d.

The first conductive line 135a and the second conductive line 135d may extend from the front surface to the back surface of the solar cell module 100 through openings, and may be directly connected to opposite ends of a capacitor unit 520 in the power conversion unit (see reference numeral 500a in FIG. 5, 500b in FIG. 6, or 500c in FIG. 7), which will be described later.

With the structure described above, no bypass diodes are provided between the first conductive line 135a, the second conductive line 135d, and the capacitor unit 520. Thus, manufacturing costs may be reduced.

Meanwhile, as illustrated in FIGS. 1 and 2, in the instance of the photovoltaic module having bypass diodes, even if shading occurs in some of the solar cells, no hot spot is generated when the bypass diodes are turned on.

However, in the state in which the photovoltaic module includes no bypass diodes as in the embodiments of the present invention, when shading occurs in some of the plurality of solar cells, a hot spot may be generated.

In order to solve the problem described above, in the present invention, when shading occurs in some of the solar cells, the power conversion unit (see reference numeral 500a in FIG. 5, 500b in FIG. 6, or 500c in FIG. 7) enables the supply of a second current, the level of which is lower than a level of a first current that was supplied before shading occurs.

That is, when sensing the occurrence of shading, the power conversion unit (see reference numeral 500a in FIG. 5, 500b in FIG. 6, or 500c in FIG. 7) causes the second current, the level of which is lower than that of the first current that was supplied before shading occurs, to be supplied, thereby reducing the possibility of generation of a hot spot, which causes an increase in temperature near the shading area. Accordingly, the photovoltaic module 50 may be stably operated.

The above-described operation will be described later in more detail with reference to FIG. 5.

Meanwhile, FIG. 3 illustrates 10 solar cells interconnected to form one string so that a total of six strings 140a, 140b, 140c, 140d, 140e and 140f are formed on the front surface of the solar cell module 100.

In order to allow all of the solar cells SLC1, ... SLCn to be interconnected in series, bus ribbons may be connected between the respective neighboring strings.

As illustrated in FIG. 3, at the lower end of the solar cell module 100, a first bus ribbon 145a is connected between a first spring 140a and a second string 140b, a third bus ribbon 145c is connected between a third string 140c and a fourth string 140d, and a fifth bus ribbon 145e is connected between a fifth string 140e and a sixth string 140f.

In addition, as illustrated in FIG. 3, at the upper end of the solar cell module 100, a second bus ribbon 145b is connected between the second string 140b and the third string 140c, and a fourth bus ribbon 145c is connected between the fourth string 140d and the fifth string 140e.

That is, excluding the upper end of the first string 140a and the upper end of the sixth string 140f among the first string 140a to the sixth string 140f, the upper ends and lower ends of the respective strings may be connected to the bus ribbons 145a to 145f as illustrated in FIG. 3.

The first conductive line 135a and the second conductive line 135d may be connected respectively to the upper end of the first string 140a and the upper end of the sixth string 140f, which are the ends of the solar cell strings that are not connected to the bus ribbons 145a to 145f, may extend to the back surface of the solar cell module 100 through the openings formed in the solar cell module 100, and may be connected to opposite ends of the capacitor unit 520 disposed on the back surface of the solar cell module 100.

Figure 5:
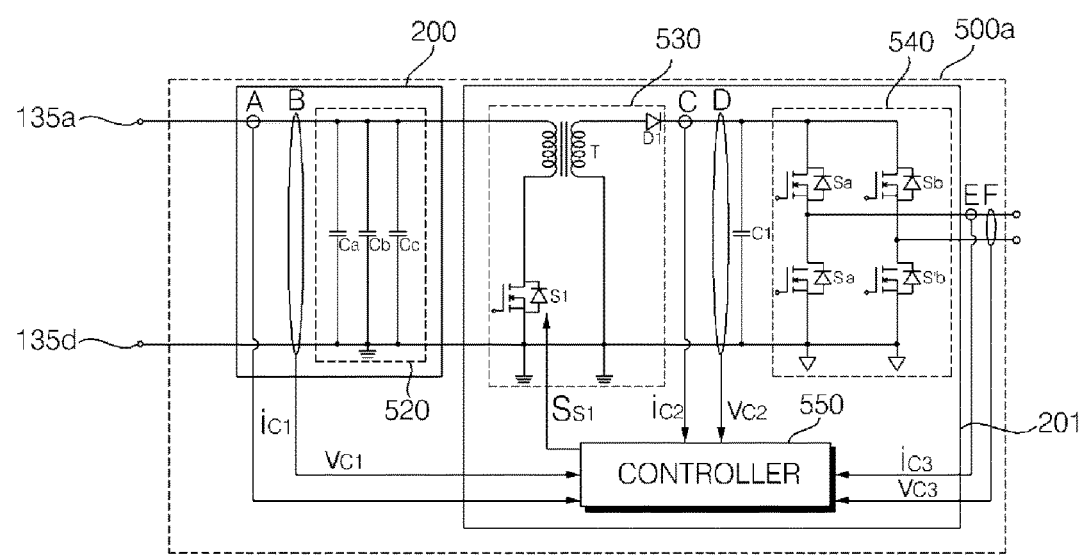
FIG. 5 is a view illustrating one example power conversion unit in the photovoltaic module of FIG. 3.

FIG. 5 is a view illustrating one example power conversion unit in the photovoltaic module of FIG. 3.

Referring to FIG. 5, the power conversion unit 500a may include the capacitor unit 520, a converter unit 530, and an inverter unit 540. Such a power conversion unit 500a may be referred to as a micro-inverter.

The power conversion unit 500a of FIG. 5 may further include a capacitor C1, an input current detector A, an input voltage detector B, a converter output current detector C, a converter output voltage detector D, an inverter output current detector E, and an inverter output voltage detector F.

The power conversion unit 500*a* of FIG. 5 has a feature of being free of bypass diodes.

In the power conversion unit 500*a* of FIG. 5, the capacitor unit 520, the input current detector A, and the input voltage detector B may be provided in the junction box 200 of FIG. 4.

The other components in the power conversion unit 500*a*, such as the converter unit 530, the inverter unit 540, the converter output current detector C, the converter output voltage detector D, the inverter output current detector E, and the inverter output voltage detector F, may be provided in, for example, a separate second junction box.

Accordingly, the photovoltaic module 50 based on FIG. 5 may include the solar cell module 100, and the power conversion unit 500*a*, which includes only the capacitor unit 520, the input current detector A, and the input voltage detector B.

The capacitor unit 520 may store a DC voltage from the solar cell module 100.

In particular, as described above, opposite ends of the capacitor unit 520 may be connected to the first conductive line 135*a* and the second conductive line 135*d*.

Although FIG. 5 illustrates the capacitor unit 520 as including a plurality of capacitors Ca, Cb and Cc interconnected in parallel, in an alternative, a plurality of capacitors may be interconnected in a series-parallel combination, or may be connected to a ground terminal in series. Alternatively, the capacitor unit 520 may include only one capacitor.

The converter unit 530 may perform power conversion using the DC voltage stored in the capacitor unit 520. That is, the converter unit 530 may include a DC/DC converter that changes the level of DC voltage.

To this end, the converter unit 530 may include, for example, a tapped inductor converter, a flyback converter, or a buck-boost converter, or may include an interleaved converter that is realized as a combination of the aforementioned converters.

FIG. 5 illustrates the converter unit 530 as including a tapped inductor converter.

The converter unit 530 illustrated in FIG. 5, i.e. the tapped inductor converter, may include a tapped inductor T, a switching element S1 connected between the tapped inductor T and a ground terminal, and a diode D1 connected to an output terminal of the tapped inductor T to perform unidirectional conduction.

A dc-terminal capacitor C1 may be connected between an output terminal of the diode D1, i.e. a cathode and the ground terminal.

Specifically, the switching element S1 may be connected between a tap of the tapped inductor T and the ground terminal. Also, the output terminal (secondary side) of the tapped inductor T may be connected to an anode of the diode D1, and the dc-terminal capacitor C1 may be connected between the cathode of the diode D1 and the ground terminal.

The primary side and the secondary side of the tapped inductor T have opposite polarities. The tapped inductor T may be referred to as a switching transformer.

The switching element S1 in the converter unit 530 may be turned on or off based on a converter switching control signal from a controller 550. Thereby, a level-changed DC voltage may be output.

The inverter unit 540 may convert the level-changed DC voltage from the converter unit 530 into an AC voltage.

FIG. 5 illustrates a full-bridge inverter. That is, upper-arm switching elements Sa and Sb and lower-arm switching elements S'a and S'b, which are interconnected in series respectively, are paired, and a total of two pairs of upper-arm and lower-arm switching elements Sa & S'a and Sb & S'b are interconnected in parallel. A diode may be connected to each of the switching elements Sa, S'a, Sb and S'b in inverse parallel.

The switching elements Sa, S'a, Sb and S'b in the inverter unit 540 may be turned on or off based on an inverter switching control signal from the controller 550. Thereby, an AC voltage having a predetermined frequency may be output. The output AC voltage may have the same frequency (ranging from approximately 60 Hz to approximately 50 Hz) as the AC frequency of a grid.

Meanwhile, the capacitor C1 may be located between the converter unit 530 and the inverter unit 540.

The capacitor C1 may store the level-changed DC voltage from the converter unit 530. Opposite ends of the capacitor C1 may be referred to as dc terminals, and thus the capacitor C1 may be referred to as a dc-terminal capacitor.

The input current detector A may detect input current $ic1$ supplied from the solar cell module 100 to the capacitor unit 520.

The input voltage detector B may detect an input voltage $Vc1$ supplied from the solar cell module 100 to the capacitor unit 520. Here, the input voltage $Vc1$ may be the same as a voltage stored in opposite ends of the capacitor unit 520.

The detected input current $ic1$ and the detected input voltage $Vc1$ may be input to the controller 550.

The converter output current detector C detects output current $ic2$ output from the converter unit 530, i.e. dc-terminal current, and the converter output voltage detector D detects an output voltage $Vc2$ output from the converter unit 530, i.e. a dc-terminal voltage. The detected output current $ic2$ and the detected output voltage $Vc2$ may be input to the controller 550.

The inverter output current detector E detects current $ic3$ output from the inverter unit 540, and the inverter output voltage detector F detects a voltage $Vc3$ output from the inverter unit 540. The detected current $ic3$ and the detected voltage $Vc3$ are input to the controller 550.

The controller 550 may output a control signal to control the switching element S1 of the converter unit 530. In particular, the controller 550 may output a turn-on timing signal for the switching element S1 in the converter unit 530 based on at least one of the detected input current $ic1$, input voltage $Vc1$, output current $ic2$, output voltage $Vc2$, output current $ic3$, and output voltage $Vc3$.

The controller 550 may output an inverter control signal to control the respective switching elements Sa, S'a, Sb and S'b in the inverter unit 540. In particular, the controller 550 may output a turn-on timing signal for the respective switching elements Sa, S'a, Sb and S'b in the inverter unit 540 based on at least one of the detected input current $ic1$, input voltage $vc1$, output current $ic2$, output voltage $vc2$, output current $ic3$, and output voltage $vc3$.

The controller 550 may calculate the maximum power point with respect to the solar cell module 100, and may control the converter unit 530 so as to output a DC voltage corresponding to the maximum power.

With relation to the embodiment of the present invention, the controller 550 may determine whether or not shading occurs in some of the solar cells based on the input current $ic1$ detected by the input current detector A or the input voltage $Vc1$ detected by the input voltage detector B. When determining that shading occurs, the controller 550 may perform a control operation to supply second current $Impp2$, the level of which is lower than that of first current $Impp1$, which was supplied before shading occurs. Thereby, even if there is no bypass diode when shading occurs, the possibility of generation of a hot spot may be reduced.

When shading occurs, the controller 550 may perform a control operation to cause the second current Impp2, the level of which is lower than that of the first current Impp1, which was supplied before shading occurs, to flow to the solar cells or the solar cell module 100.

The controller 550 may perform a control operation to prevent the generation of a hot spot in the solar cell module 100. That is, as described above, when shading occurs, the controller 550 may perform a control operation to supply the second current Impp2, the level of which is lower than that of the first current Impp1, which was supplied before shading occurs.

When a voltage variation rate of the input voltage Vc1 detected by the input voltage detector B is a predetermined value or more, the controller 550 may determine that shading occurs, and may perform a control operation to supply the second current Impp2, the level of which is lower than that of the first current Impp1, so as to prevent the generation of a hot spot in the solar cell module 100.

When shading occurs in the solar cell module 100, the controller 550 may calculate a plurality of maximum power points with respect to the range of DC voltages supplied from the solar cell module 100 in which shading occurs, may determine the maximum value of the calculated maximum power points to be the maximum power point, and may perform a control operation to supply a second voltage Vmpp2 corresponding to the maximum power point.

Meanwhile, when shading occurs, the controller 550 may calculate the inflection point of a voltage-power curve within the range of a DC voltage that may be supplied from the solar cell module 100 in which shading occurs, and may determine the calculated inflection point to be the maximum power point mpp2. Then, the controller 550 may control the solar cell module 100 to supply a second voltage Vmpp2, which corresponds to the maximum power point mpp2.

Figure 6:
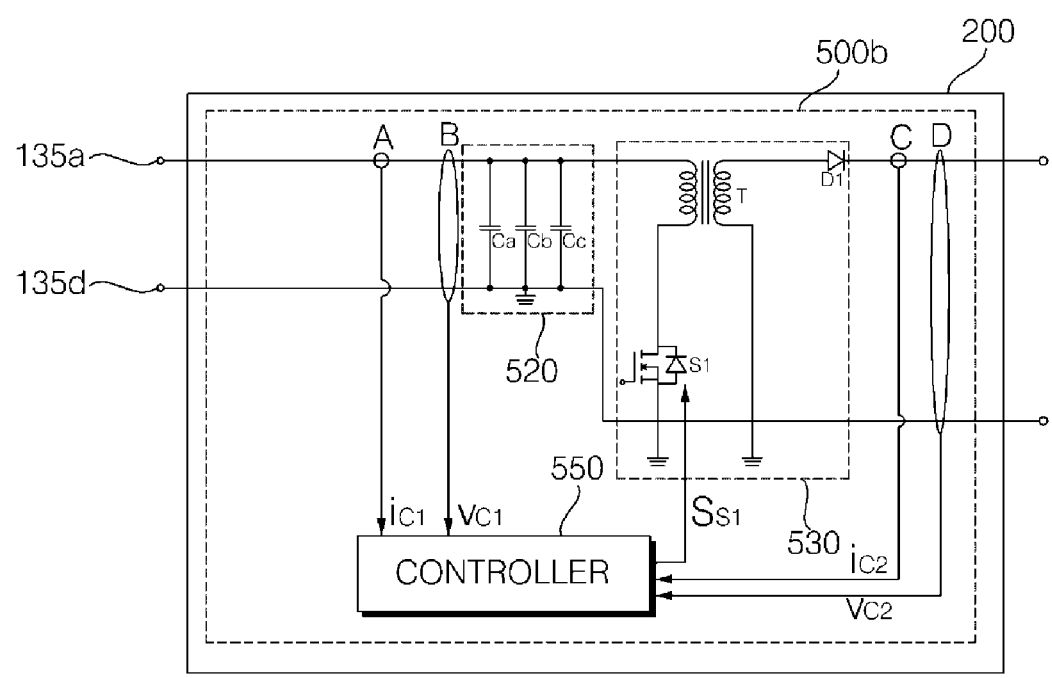
FIG. 6 is a view illustrating another example power conversion unit in the photovoltaic module of FIG. 3.

FIG. 6 is a view illustrating another example power conversion unit in the photovoltaic module of FIG. 3.

Although the power conversion unit 500*b* of FIG. 6 is similar to the power conversion unit 500*a* of FIG. 5, unlike FIG. 5, the inverter unit 540, the capacitor C1, the inverter output current detector E, and the inverter output voltage detector F are not provided.

That is, the power conversion unit 500*b* of FIG. 6 may include the capacitor unit 520, the converter unit 530, the input current detector A, the input voltage detector B, the converter output current detector C, and the converter output voltage detector D.

The entire power conversion unit 500*b* may be provided in the junction box 200.

Accordingly, the photovoltaic module 50 based on FIG. 6 may include the solar cell module 100, and the power conversion unit 500*b*, which includes the capacitor unit 520, the converter unit 530, the input current detector A, the input voltage detector B, the converter output current detector C, and the converter output voltage detector D.

Figure 7:
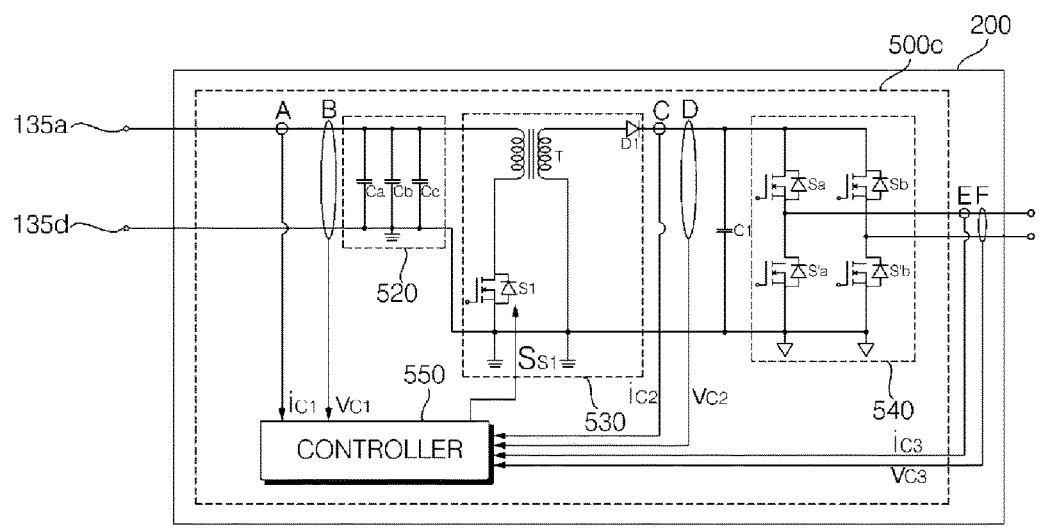
FIG. 7 is a view illustrating a further example power conversion unit in the photovoltaic module of FIG. 3.

FIG. 7 is a view illustrating a further example power conversion unit in the photovoltaic module of FIG. 3.

Although the power conversion unit 500*c* of FIG. 7 is similar to the power conversion unit 500*b* of FIG. 6, unlike FIG. 6, the inverter unit 540, the capacitor C1, the inverter output current detector E, and the inverter output voltage detector F are provided.

That is, the power conversion unit 500*c* of FIG. 7 may include the capacitor unit 520, the converter unit 530, the inverter unit 540, the capacitor C1, the input current detector A, the input voltage detector B, the converter output current detector C, the converter output voltage detector D, the inverter output current detector E, and the inverter output voltage detector F.

The entire power conversion unit 500*c* may be provided in the junction box 200.

Accordingly, the photovoltaic module 50 based on FIG. 7 may include the solar cell module 100, and the power conversion unit 500*c*, which includes the capacitor unit 520, the converter unit 530, the inverter unit 540, the capacitor C1, the input current detector A, the input voltage detector B, the converter output current detector C, the converter output voltage detector D, the inverter output current detector E, and the inverter output voltage detector F.

Since the photovoltaic module 50 based on FIG. 7 may directly output an AC voltage via the solar cell module 100 and the junction box 200, the photovoltaic module 50 may be referred to as an integrated photovoltaic module or a photovoltaic AC module.

Figure 8:
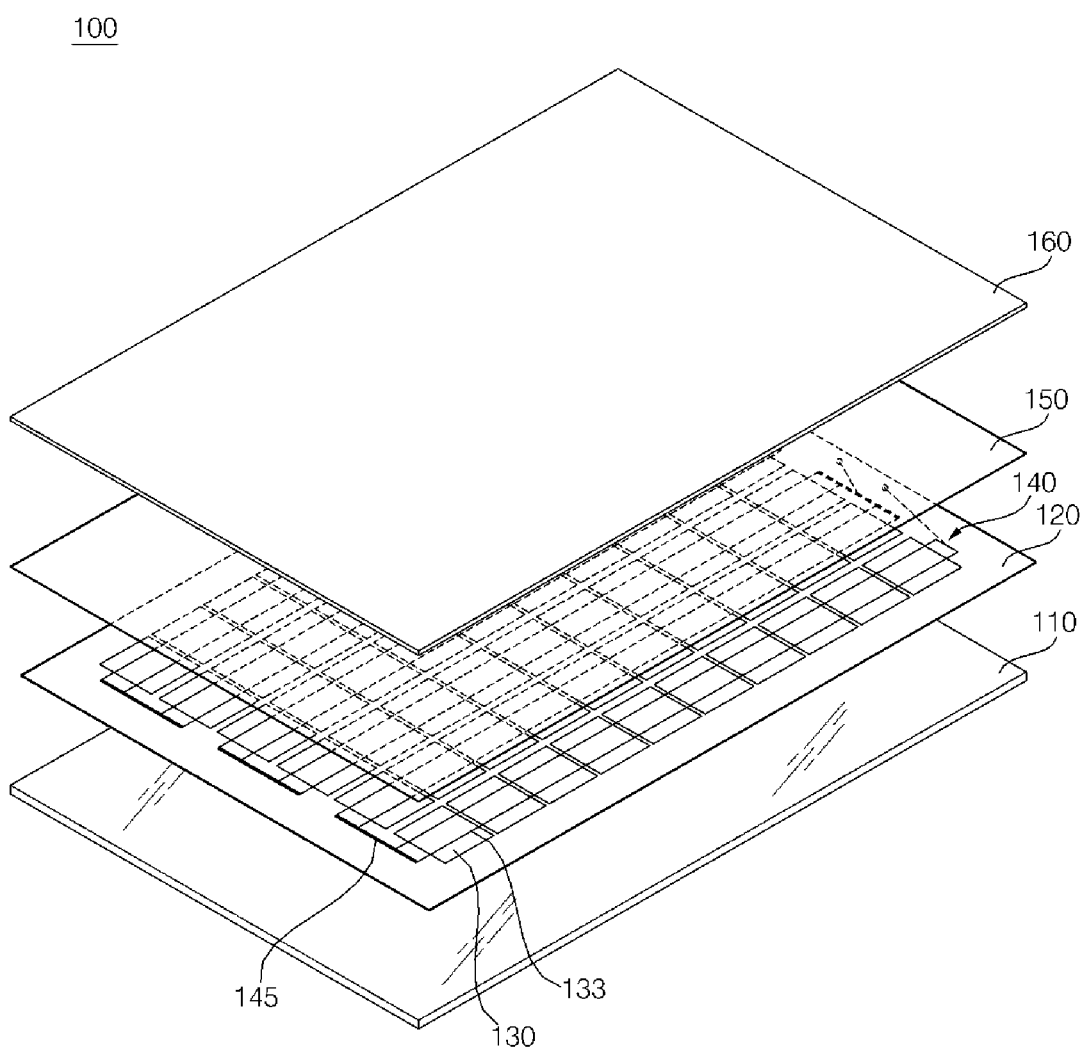
FIG. 8 is an exploded perspective view of a solar cell module of FIG. 3.

FIG. 8 is an exploded perspective view of the solar cell module of FIG. 3.

Referring to FIG. 8, the solar cell module 100 of FIG. 3 may include a plurality of solar cells 130. In addition, the solar cell module 100 may further include a first sealing member 120 and a second sealing member 150, which are disposed on the lower surface and the upper surface of the solar cells 130, a back substrate 110 disposed on the lower surface of the first sealing member 120, and a front substrate 160 disposed on the upper surface of the second sealing member 150.

First, the solar cells 130 are semiconductor devices that convert solar energy into electrical energy, and may be, for example, silicon solar cells, compound semiconductor solar cells, tandem solar cells, dye sensitized solar cells, or CdTe or CIGS type solar cells.

Each of the solar cells 130 includes a light-receiving surface on which sunlight is incident and a back surface opposite to the light-receiving surface. For example, the solar cell 130 may include a first conductive silicon substrate, a second conductive semiconductor layer formed on the silicon substrate, the second conductive type being contrary to the first conductive type, an anti-reflection layer formed on the second conductive semiconductor layer and having at least one opening for exposing a surface portion of the second conductive semiconductor layer, a front electrode formed in contact with the surface portion of the second conductive semiconductor layer exposed through the opening, and a back electrode formed on the back surface of the silicon substrate.

The respective solar cells 130 may be electrically interconnected in series, in parallel, or in a series-parallel combination. Specifically, the solar cells 130 may be electrically interconnected using ribbons 133. Each ribbon 133 may be bonded to the front electrode formed on the light-receiving surface of one solar cell 130 and the back electrode formed on the back surface of another neighboring solar cell 130.

FIG. 8 illustrates the ribbons 133 as being formed in two rows and also illustrates the solar cells 130 as being interconnected in a line by the ribbons 133 to form a solar cell string 140.

Thereby, as described above with reference to FIG. 3, six solar cell strings 140*a*, 140*b*, 140*c*, 140*d*, 140*e* and 140*f* are formed, and each string consists of ten solar cells.

The back substrate 110 may be a back sheet having waterproof, insulation, and ultraviolet (UV) blocking functions, and may be of a Tedlar/PET/Tedlar (TPT) type, without being limited thereto. In addition, while the back substrate 110 is illustrated in FIG. 7 as having a rectangular shape, the back substrate 110 may be fabricated into various other shapes, such as circular and semicircular shapes, according to the environment in which the solar cell module 100 is installed.

The first sealing member 120 may be attached to the back substrate 110 so as to have the same size as the back substrate 110, and the solar cells 130 may be arranged next to one another so as to form a plurality of lines on the first sealing member 120.

The second sealing member 150 may be disposed over the solar cells 130 and may be bonded to the first sealing member 120 via lamination.

Here, the first sealing member 120 and the second sealing member 150 enable a chemical bond of respective elements of the solar cells 130. The first sealing member 120 and the second sealing member 150 may be formed of any one of various materials, such as ethylene vinyl acetate (EVA) films.

Meanwhile, the front substrate 160 may be disposed on the second sealing member 150 so as to permit passage of sunlight therethrough. The front substrate 160 may be formed of tempered glass in order to protect the solar cells 130 from external shocks, etc. In addition, in order to prevent reflection of sunlight and to enhance light-transmittance, the front substrate 160 may be formed of low-iron tempered glass.

Figure 9:
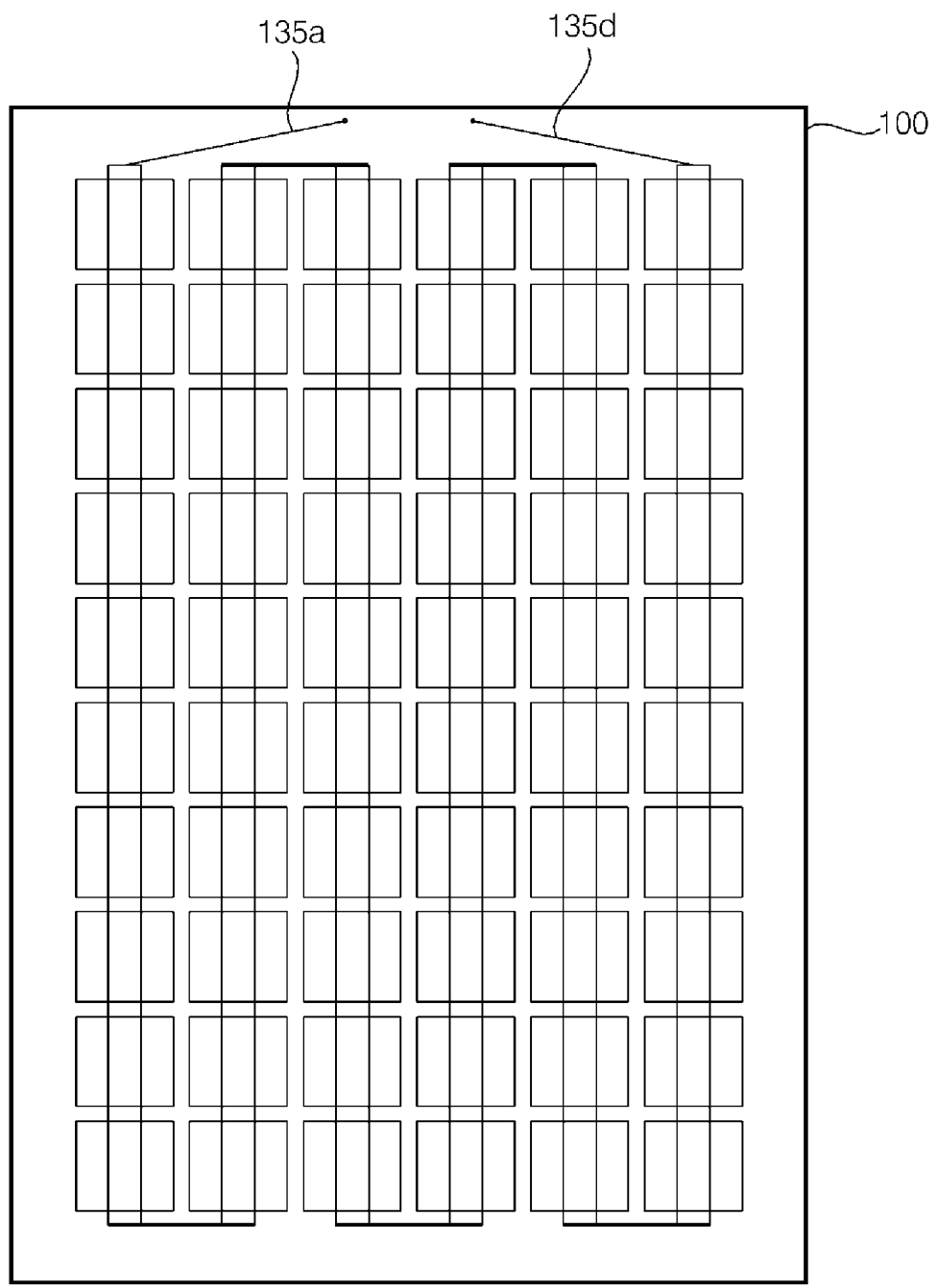
FIG. 9 is a view illustrating the instance where no shading occurs in the solar cell module of FIG. 3.

FIG. 9 is a view illustrating the instance where no shading occurs in the solar cell module of FIG. 3.

Referring to FIG. 9, among the six solar cell strings 140a, 140b, 140c, 140d, 140e and 140f, the first conductive line 135a is connected to the upper end of the first solar cell string 140a, and the second conductive line 135d is connected to the upper end of the sixth solar cell string 140f.

Meanwhile, when a normal solar cell in which no shading occurs generates a voltage of approximately 0.5V, 60 solar cells may generate a DC voltage of approximately 30V (=0.5*60). At this time, the current flowing through each solar cell may be approximately 9 A.

Figure 10:
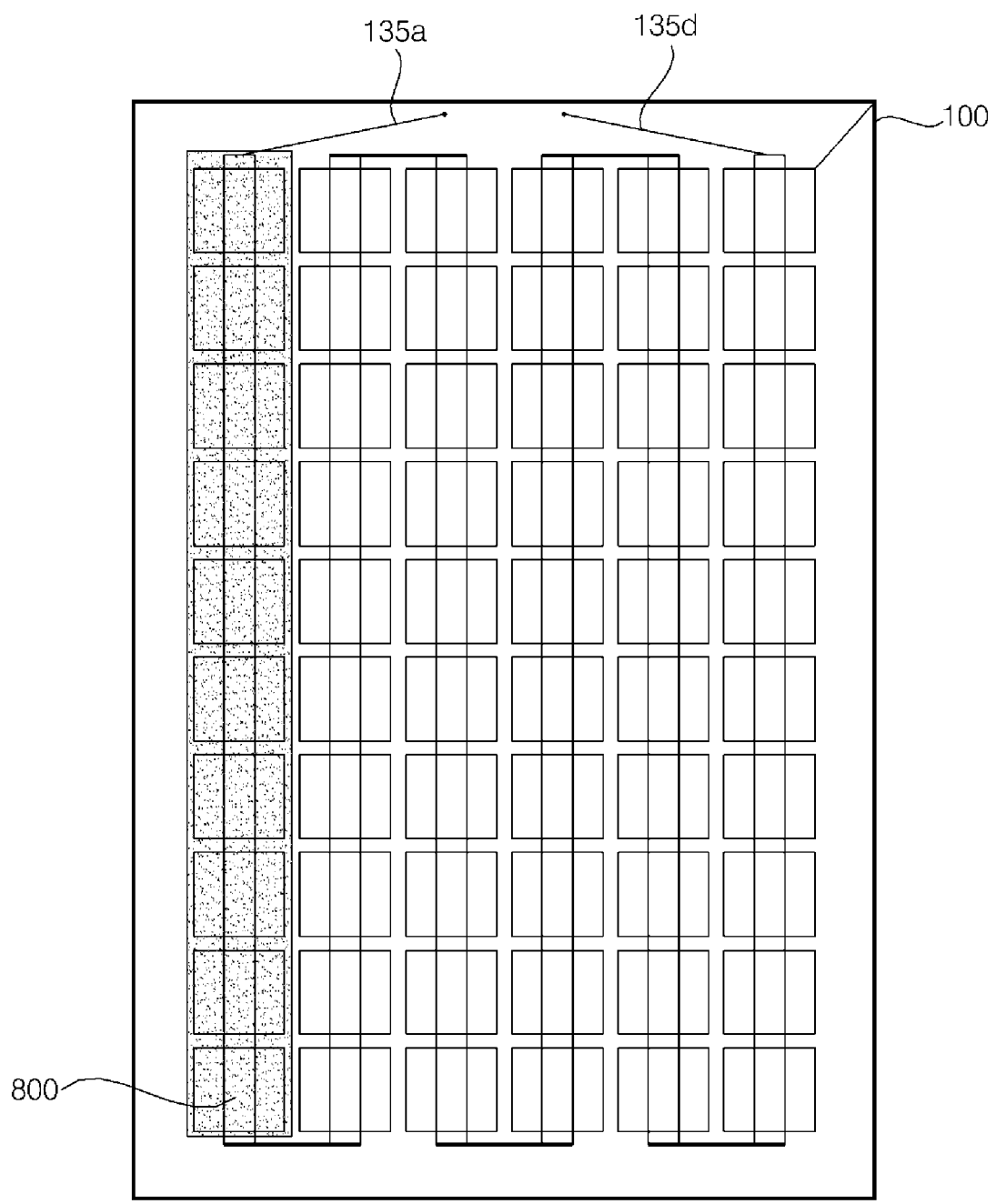
FIG. 10 is a view illustrating the instance where shading occurs in the solar cell module of FIG. 3.

FIG. 10 is a view illustrating the instance where shading occurs in the solar cell module of FIG. 3.

Referring to FIG. 10, among the six solar cell strings 140a, 140b, 140c, 140d, 140e and 140f in the solar cell module 100, shading 800 occurs in the first solar cell string 140a.

When the shading 800 occurs, each solar cell in the first solar cell string 140a cannot supply the aforementioned DC voltage of approximately 0.5V. For example, an inverse voltage (approximately −15V) may be generated.

In addition, when the shading 800 occurs, the current flowing to each solar cell in the first solar cell string 140a is reduced to approximately 3 A, and thus in the entire solar cell module 100, a current of 9 A in FIG. 9 does not flow, but a current of 3 A flows.

Thereby, a current of 6 A, which is the difference between the current of 9 A and the current of 3 A, flows near the solar cell in which shading occurs, and thus a hot spot may be generated.

In the instance of the photovoltaic module 50 having no bypass diodes as in the embodiments of the present invention, the possibility of generation of a hot spot due to the occurrence of shading is increased.

In order to solve this problem, when shading occurs in some of the solar cells, the photovoltaic module 50 of the present invention supplies the second current Impp2, the level of which is lower than that of the first current Impp1, which was supplied before shading occurs. Thereby, the possibility of generation of a hot spot may be reduced even if there is no bypass diode when shading occurs.

This will be described below in more detail with reference to FIG. 11.

Figure 11:
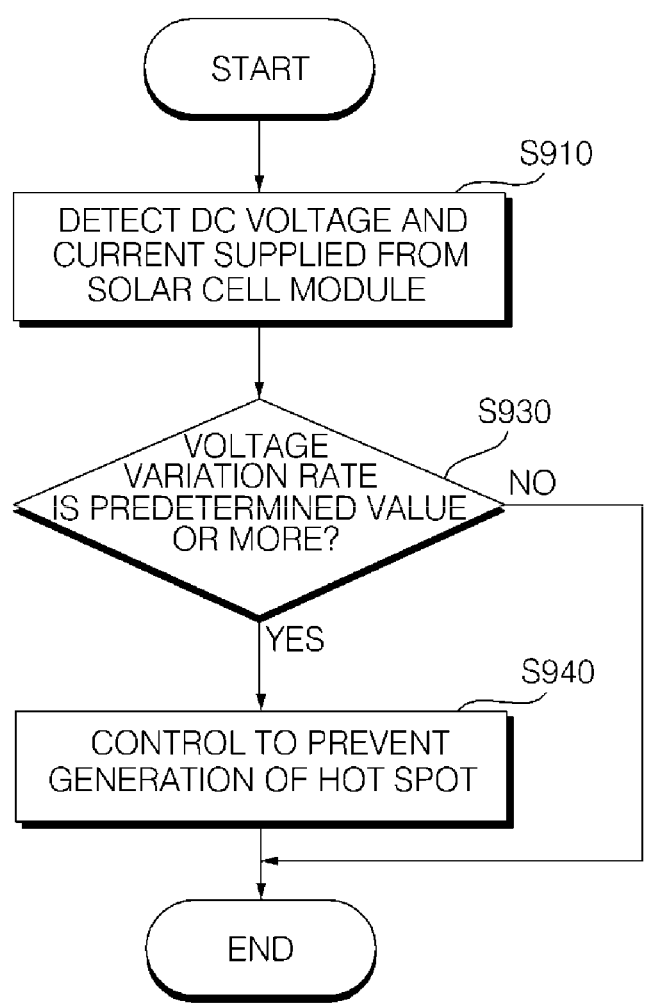
FIG. 11 is a flowchart illustrating a method of operating the photovoltaic module according to the embodiment of the present invention.

FIG. 11 is a flowchart illustrating a method of operating the photovoltaic module according to the embodiment of the present invention, and FIGS. 12A to 14 are views to be referred in the description of the control method of FIG. 11.

First, referring to FIG. 11, the input current detector A and the input voltage detector B of the photovoltaic module 50 respectively detect input current ic1 and an input voltage Vc1 (S910).

The controller 550 may receive the input current ic1 and the input voltage Vc1 detected by the input current detector A and the input voltage detector B.

Subsequently, the controller 550 determines whether or not the voltage variation rate of the input voltage Vc1, detected by the input voltage detector B, is a predetermined value or more (S930). When the variation rate is the predetermined value or more, the controller 550 performs a control operation to prevent the generation of a hot spot (S940).

The controller 550 may periodically check the voltage variation rate of the input voltage Vc1 detected by the input voltage detector B.

When the shading 800 occurs as illustrated in FIG. 10, the input DC voltage supplied from the solar cell module may be changed from approximately 30V to approximately 25V.

Thereby, the controller 550 may determine that shading occurs in the solar cell module 100 when the voltage variation rate is a predetermined value (3V/sec or 3V/min) or more.

Accordingly, in order to prevent the generation of a hot spot due to shading, the controller 550 may perform a control operation to supply second current Impp2, the level of which is lower than the level of first current Impp1, which was supplied before shading occurs.

Figure 12A:
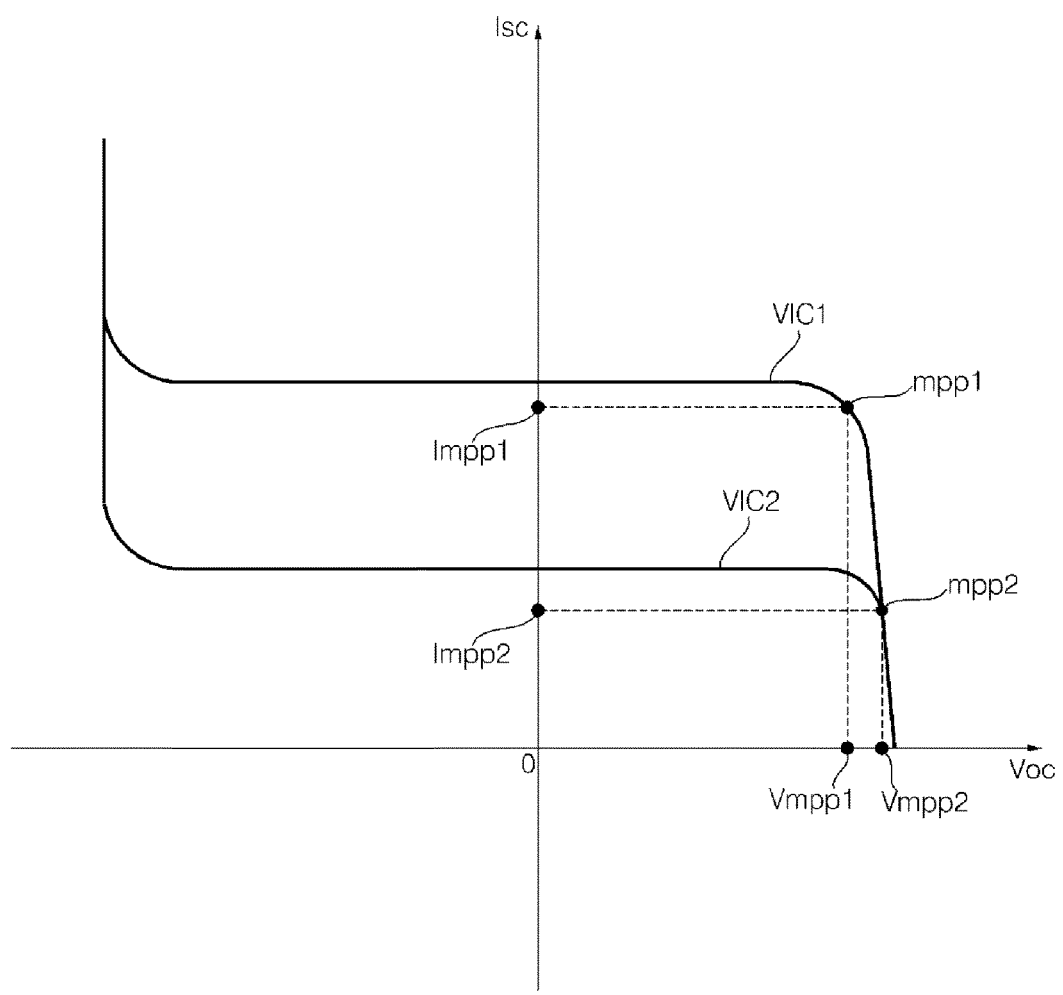
FIGS. 12A to 14 are views to be referred in the description of the control method of FIG. 11.

FIG. 12A illustrates a voltage-current curve V1C1 for the solar cell module before shading occurs and a voltage-current curve V1C2 for the solar cell module after shading occurs.

Figure 12B:
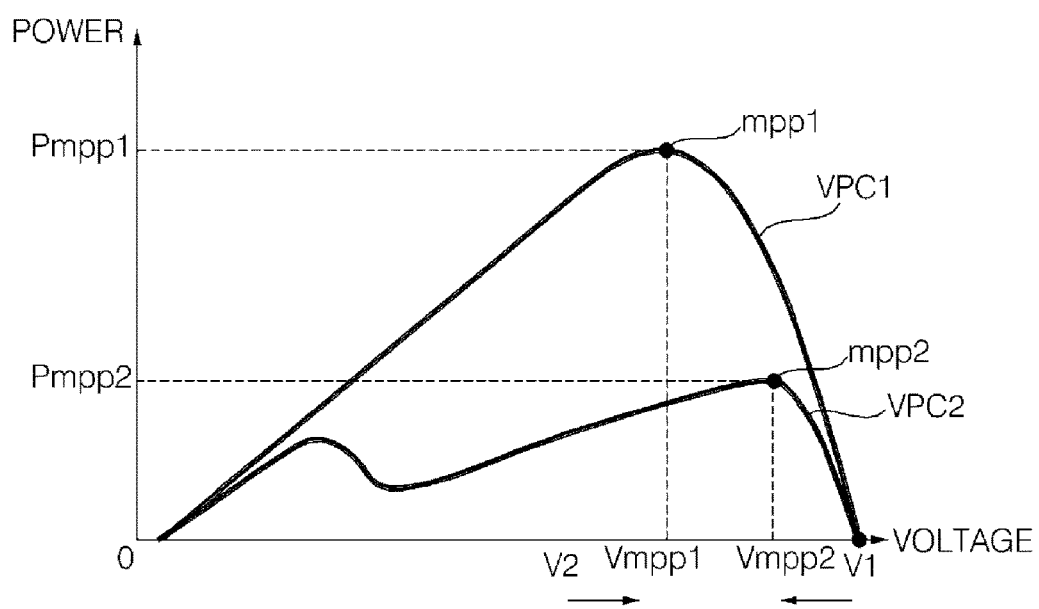

Meanwhile, FIG. 12B illustrates a voltage-power curve VPC1 for the solar cell module before shading occurs and a voltage-power curve VPC2 for the solar cell module after shading occurs.

According to FIGS. 12A and 12B, before shading occurs, the controller 550 calculates power for each voltage using a maximum power point tracking (MPPT) algorithm while reducing an open-circuit voltage Voc from a maximum voltage V1, and determines whether or not the calculated power is maximum power.

Because power is increased at the voltage range from V1 to Vmpp1, the controller 550 updates and stores the calculated power. Then, because power is reduced at the voltage range from Vmpp1 to V2, consequently, the controller 550 determines power Pmpp1, which corresponds to the voltage Vmpp1, to be maximum power.

Accordingly, before shading occurs, the solar cell module 100 supplies the voltage Vmpp1 and the current Impp1. Here, the voltage Vmpp1 may be approximately 30V and the current Impp1 may be approximately 9 A. That is, before shading occurs, the solar cell module 100 may supply power of approximately 270 W.

Meanwhile, when the input DC voltage supplied from the solar cell module 100 is changed from approximately 30V to approximately 25V, the controller 550 may determine that shading occurs, and may perform a control operation to perform the maximum power point tracking algorithm in consideration of the occurrence of shading.

According to the maximum power point tracking algorithm depending on the occurrence of shading, as illustrated in FIGS. 12A and 12B, the voltage-current curve for the solar cell module is changed from the voltage-current curve V1C1 to the voltage-current curve V1C2, and the voltage-power curve for the solar cell module is changed from the voltage-power curve VPC1 to the voltage-power curve VPC2.

Thereby, the controller 550 calculates power for each voltage using the maximum power point tracking (MPPT) algorithm while reducing an open-circuit voltage Voc from the maximum voltage V1, and determines whether or not the calculated power is maximum power.

Because power is increased at the voltage range from V1 to Vmpp2, the controller 550 updates and stores the calculated power. Then, because power is reduced at the voltage range from Vmpp2 to V2, consequently, the controller 550 determines power Pmpp2, which corresponds to the voltage Vmpp2, to be maximum power.

At this time, the voltage Vmpp2 has a higher level than that of the voltage Vmpp1 as illustrated in the drawings.

Thereby, after shading occurs, the solar cell module 100 supplies the voltage Vmpp2 and the current Impp2. Here, the voltage Vmpp2 may be approximately 33V and the current Impp2 may be approximately 3 A. That is, after shading occurs, the solar cell module 100 may supply power of approximately 100 W.

In conclusion, according to the maximum power point tracking algorithm, when shading occurs, the solar cell module 100 supplies a second voltage, which is greater than the first voltage that was supplied before shading occurs, and supplies second current, which is less than first current that was supplied before shading occurs.

In addition, according to the maximum power point tracking algorithm, when shading occurs, the solar cell module 100 supplies second power, which is less than first power that was supplied before shading occurs.

As described above, because the current supplied from the solar cell module 100 in which shading occurs is reduced, a hot spot that causes an increase in temperature is not generated in the area of the shading 800 in FIG. 10. Accordingly, despite the occurrence of shading and despite the absence of bypass diodes, the solar cell module 100 may be stably operated.

Figure 13A:
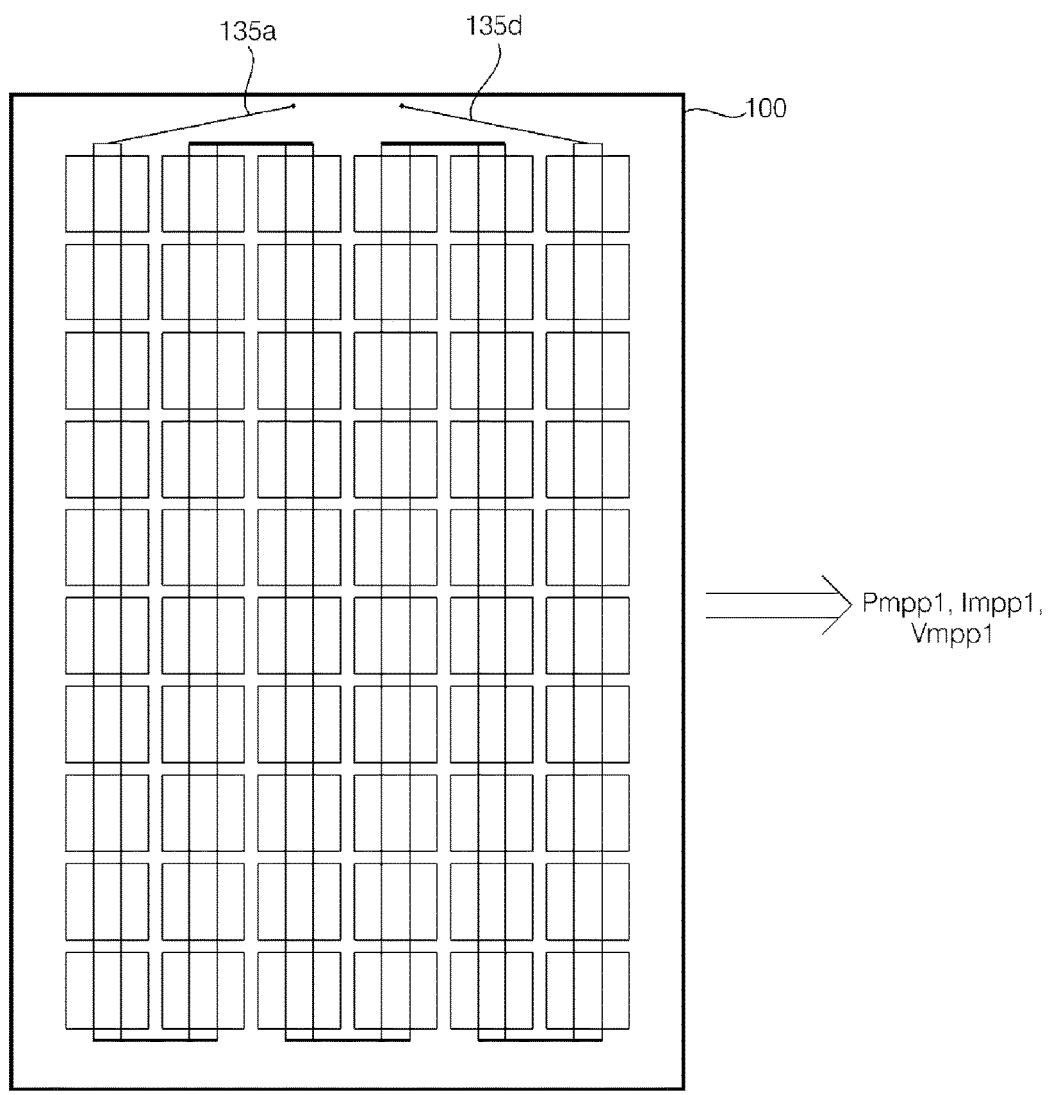
Figure 13B:
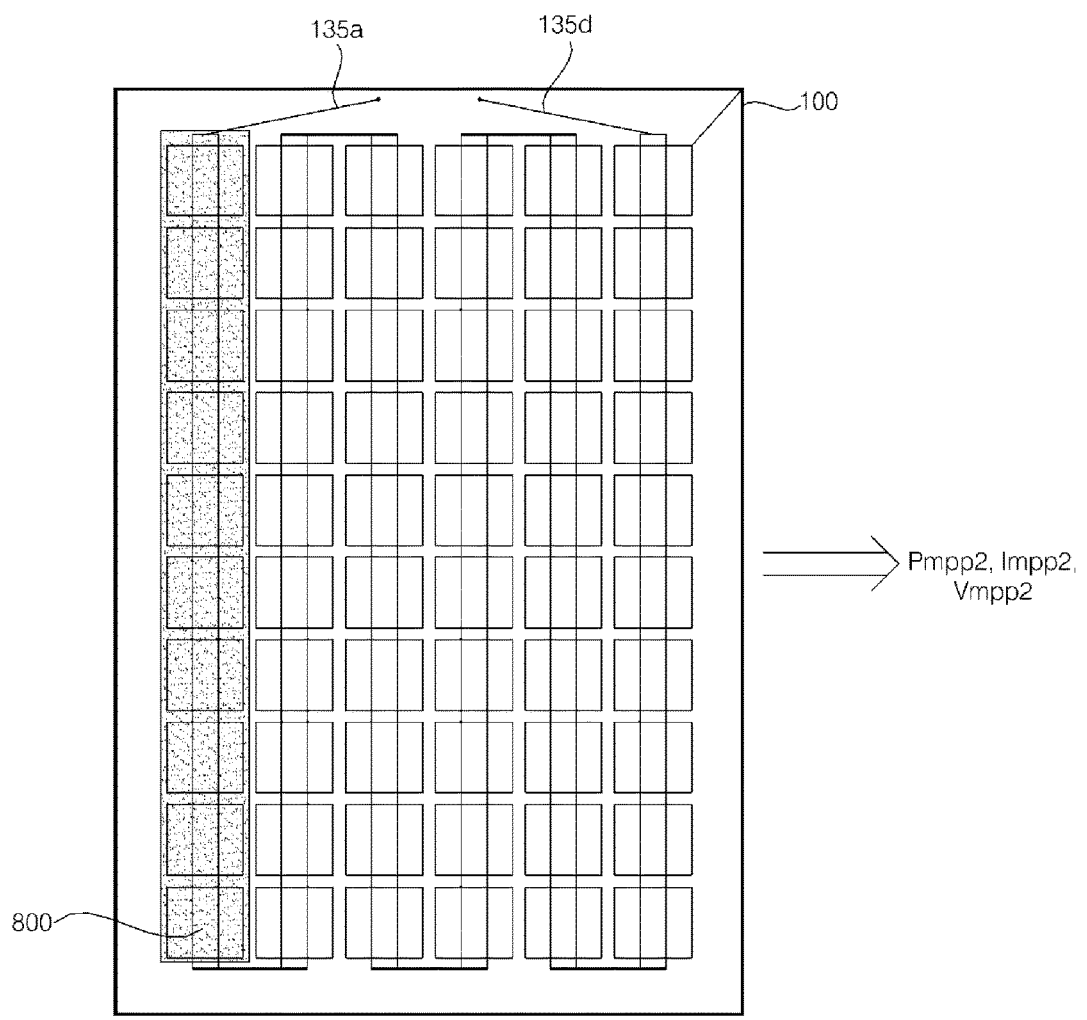

FIG. 13A illustrates the power Pmpp1, voltage Vmpp1 and current Impp1 for the solar cell module 100 before shading occurs, and FIG. 13B illustrates the power Pmpp2, voltage Vmpp2 and current Impp2 for the solar cell module 100 after shading occurs.

As described above, only the voltage Vmpp2 in FIG. 13B is higher than the voltage Vmpp1 in FIG. 13A, and the power Pmpp2 and the current Impp2 in FIG. 13B are lower than the power Pmpp1 and the current Impp1 in FIG. 13A.

Figure 14:
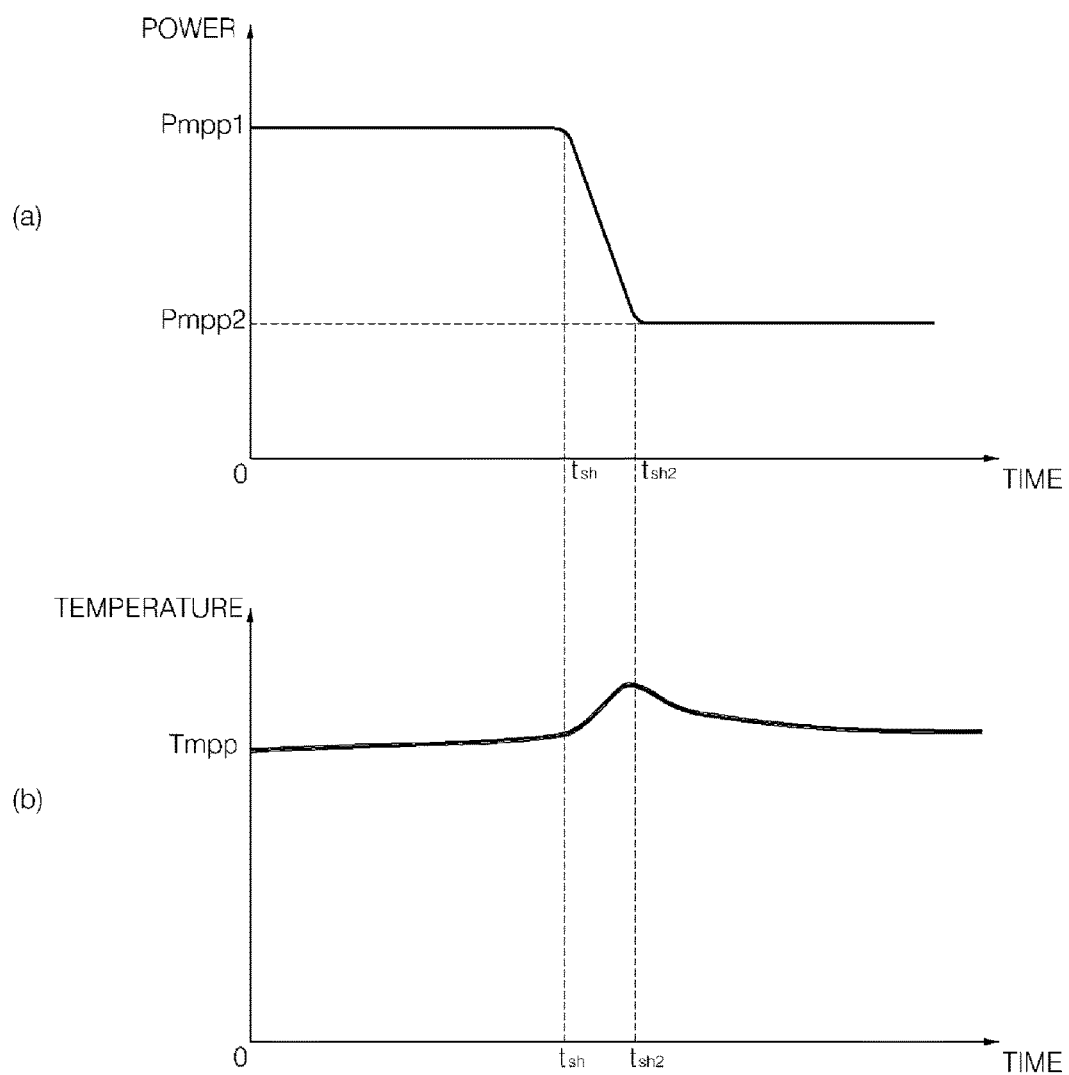

Meanwhile, FIG. 14 illustrates a time-power curve that represents variation in power depending on the lapse of time and a time-temperature curve that represents variation in temperature depending on the lapse of time.

In FIG. 14, (a) illustrates the time-power curve.

Referring to (a) of FIG. 14, the solar cell module 100 may supply the power Pmpp1 before a time point tsh and may then supply the power Pmpp2 from a time point tsh2 when shading occurs at the time point Tsh.

In FIG. 14, (b) illustrates the time-temperature curve.

Referring to (b) of FIG. 14, the solar cell module 100 may maintain an approximate temperature Tmpp before a time point tsh. When shading occurs at the time point tsh, the temperature may begin to be increased and may then be reduced from a time point tsh2 to thereby be maintained at the approximate temperature Tmpp.

As described above, the controller 550 maintains a first temperature before shading occurs. Then, when the temperature is increased from the first temperature to a second temperature due to the occurrence of shading, the controller 550 performs a control operation using the maximum power point tracking algorithm so as to supply second current, which is less than first current that was supplied before shading occurs, to supply a second voltage, which is higher than a first voltage that was supplied before shading occurs, and consequently to supply second power, which is less than first power that was supplied before shading occurs.

In conclusion, the controller 550 may perform a control operation to lower the temperature of the solar cell module 100 from the time point tsh2 at which the second power Pmpp2 is supplied by supplying the second current, which is less than the first current that was supplied before shading occurs, or by supplying the second power Pmpp2, which is less than the first power Pmpp1 that was supplied before shading occurs. In this way, even if shading occurs, the solar cell module 100 may be stably operated. Meanwhile, in the present invention, by determining whether or not shading occurs based on variation in voltage detected by the input voltage detector B, rather than variation in the temperature of the solar cell module 100, and performing a control operation based on the determined result, rapid control in response to changes in temperature is possible, and, for example, a separate temperature sensor may be obviated, which may reduce manufacturing costs.

The photovoltaic module according to the embodiments of the present invention need not be limitedly applied to the configuration and method of the embodiments as described above and, however, some or all of the embodiments may be selectively combined with one another to achieve various modifications.

As is apparent from the above description, a photovoltaic module according to one embodiment of the present invention includes a solar cell module, which includes a plurality of solar cells, a first conductive line connected to a first solar cell among the solar cells, and a second conductive line connected to a second solar cell among the solar cells, and a junction box attached to the back surface of the solar cell module. The junction box includes a power conversion unit, which includes a capacitor unit located between the first conductive line and the second conductive line, a converter unit to change the level of a DC voltage at opposite ends of the capacitor unit and to output the level-changed DC voltage, and a controller to control the converter unit. When shading occurs in some of the solar cells, the power conversion unit supplies a second current, the level of which is lower than that of a first current that was supplied before shading occurs, whereby the possibility of generation of a hot spot may be reduced even if there are no bypass diodes when shading occurs.

Meanwhile, when the voltage variation rate of an input voltage detected by an input voltage detector is a predetermined value or more, the photovoltaic module may perform a control operation to supply the second current, the level of which is lower than the level of the first current, whereby the possibility of generation of a hot spot may be reduced even if there are no bypass diodes when shading occurs.

When shading occurs, the photovoltaic module calculates a plurality of maximum power points with respect to the range of DC voltages supplied from the solar cell module in which shading occurs, determines the maximum value of the calculated maximum power points to be the maximum power point, and supplies second current corresponding to the maximum power point, thereby enabling the output of maximum power when shading occurs.

Meanwhile, the photovoltaic module includes bus ribbons connected to the ends of solar cell strings, each of which is formed by interconnecting some of the solar cells in a line. The first conductive line and the second conductive line are connected respectively to the ends of the solar cell strings that are not connected to the bus ribbons, extend to the back surface of the solar cell module through openings formed in the solar cell module, and are connected to opposite ends of the capacitor unit disposed on the back surface of the solar cell module. Thereby, the photovoltaic module may be realized so as to deal with the occurrence of shading without requiring bypass diodes, which enables a reduction in manufacturing costs.

A photovoltaic module according to another embodiment of the present invention includes a solar cell module, which includes a plurality of solar cells, a first conductive line connected to a first solar cell among the solar cells, and a second conductive line connected to a second solar cell among the solar cells, and a junction box attached to the back surface of the solar cell module. The junction box includes a power conversion unit, which includes a capacitor unit located between the first conductive line and the second conductive line, a converter unit to change the level of a DC voltage at opposite ends of the capacitor unit and to output the level-changed DC voltage, and a controller to control the converter unit. When shading occurs in some of the solar cells, the power conversion unit supplies the second current, the level of which is lower than that of the first current that was supplied before shading occurs, whereby the possibility of generation of a hot spot may be reduced even if there are no bypass diodes when shading occurs.

A photovoltaic module according to a further embodiment of the present invention includes a solar cell module, which includes a plurality of solar cells, a first conductive line connected to a first solar cell among the solar cells, and a second conductive line connected to a second solar cell among the solar cells, and a junction box attached to the back surface of the solar cell module. The junction box includes a power conversion unit, which includes a capacitor unit located between the first conductive line and the second conductive line, a converter unit to change the level of a DC voltage at opposite ends of the capacitor unit and to output the level-changed DC voltage, an inverter unit to convert the level-changed DC voltage into an AC voltage and to output the AC voltage, and a controller to control the converter unit and the inverter unit. When shading occurs in some of the solar cells, the power conversion unit supplies a second current, the level of which is lower than that of a first current that was supplied before shading occurs, whereby the possibility of generation of a hot spot may be reduced even if there are no bypass diodes when shading occurs.

Although the embodiments of the present invention have been disclosed for illustrative purposes, those skilled in the art will appreciate that the present invention is not limited to the above-described embodiments and various modifications are possible without departing from the scope and spirit of the invention as disclosed in the accompanying claims. These modifications should not be understood separately from the idea or outlook of the present invention.

What is claimed is:

1. A photovoltaic module comprising:
   a solar cell module including a plurality of solar cells, a first conductive line connected to a first solar cell among the plurality of solar cells, and a second conductive line connected to a second solar cell among the plurality of solar cells; and
   a junction box attached to a back surface of the solar cell module,
   wherein the junction box includes a power conversion unit including a capacitor unit located between the first conductive line and the second conductive line,
   wherein, when shading occurs in some of the plurality of solar cells, the power conversion unit supplies a second current, a level of which is lower than a level of a first current that was supplied before the shading occurs, without bypass for at least one of the first conductive line and the second conductive line,
   wherein the power conversion unit further includes:
      an input voltage detector to detect an input voltage at opposite ends of the capacitor unit; and
      a controller configured to supply the first current, and
   wherein, when a voltage variation rate of the input voltage detected by the input voltage detector is a predetermined value or more, the controller determines that the shading occurs, and supplies the second current.

2. The photovoltaic module according to claim 1, wherein the power conversion unit further includes:
   an input current detector to detect an input current flowing to the capacitor unit, and
   wherein the controller is configured to determine whether or not the shading occurs in some of the plurality of solar cells based on the input current detected by the input current detector, and when determining the occurrence of the shading, to perform a control operation to supply the second current, the level of which is lower than the level of the first current that was supplied before the shading occurs.

3. The photovoltaic module according to claim 1, wherein, when the shading occurs, the controller controls the solar cell module so as to output a second voltage, a level of which is higher than a level of a first voltage that was output from the solar cell module before the shading occurs.

4. The photovoltaic module according to claim 1, wherein, when the shading occurs, the controller performs a control operation to prevent generation of a hot spot in the solar cell module.

5. The photovoltaic module according to claim 1, wherein the power conversion unit further includes a converter unit to change a level of a DC voltage at the opposite ends of the capacitor unit and to output the level-changed DC voltage.

6. The photovoltaic module according to claim 1, wherein the power conversion unit further includes:
   a converter unit to change a level of a DC voltage at the opposite ends of the capacitor unit and to output the level-changed DC voltage; and
   an inverter unit to convert the level-changed DC voltage into an AC voltage and to output the AC voltage, and
   wherein the controller controls the converter unit and the inverter unit.

7. The photovoltaic module according to claim 5, wherein, when the shading occurs in the solar cell module, the controller performs a control operation to calculate a plurality of maximum power points with respect to a range of DC voltages supplied from the solar cell module in which the shading occurs, to determine a maximum value of the calculated maximum power points to be a maximum power point, and to supply the second current corresponding to the maximum power point.

8. The photovoltaic module according to claim 7, wherein the controller calculates an inflection point of a voltage-power curve within the range of DC voltages, and determines the calculated inflection point to be the maximum power point.

9. The photovoltaic module according to claim 6, wherein, when the shading occurs in the solar cell module, the controller performs a control operation to calculate a plurality of maximum power points with respect to a range of DC voltages supplied from the solar cell module in which the shading occurs, to determine a maximum value of the calculated maximum power points to be a maximum power point, and to supply the second current corresponding to the maximum power point.

10. The photovoltaic module according to claim 9, wherein the controller calculates an inflection point of a voltage-power curve within the range of DC voltages, and determines the calculated inflection point to be the maximum power point.

11. The photovoltaic module according to claim 1, wherein the solar cell module further includes:
   a first sealing member and a second sealing member formed respectively on a lower surface and an upper surface of the plurality of solar cells;
   a back substrate formed on a lower surface of the first sealing member; and
   a front substrate formed on an upper surface of the second sealing member.

12. The photovoltaic module according to claim 11, wherein the solar cell module further includes a bus ribbon connected to an end of a solar cell string, which is formed by interconnecting some of the plurality of solar cells in a line, and
   wherein each of the first conductive line and the second conductive line is connected to an end of the solar cell string that is not connected to the bus ribbon, extends to the back surface of the solar cell module through an opening formed in the solar cell module, and is connected to each end of the capacitor unit disposed on the back surface of the solar cell module.

13. The photovoltaic module according to claim 1, wherein, when the shading occurs, the controller controls the solar cell module so as to output second power, which is less than first power that was output from the solar cell module before the shading occurs.

14. The photovoltaic module according to claim 13, wherein, when shading occurs in some of the plurality of solar cells, the controller performs a control operation to cause a temperature of the solar cell module to be reduced from a time when the second power is supplied.

15. A photovoltaic module comprising:
   a solar cell module including a plurality of solar cells, a first conductive line connected to a first solar cell among the plurality of solar cells, and a second conductive line connected to a second solar cell among the plurality of solar cells; and
   a junction box attached to a back surface of the solar cell module,
   wherein the junction box includes a power conversion unit, which includes a capacitor unit located between the first conductive line and the second conductive line, a converter unit to change a level of a DC voltage at opposite ends of the capacitor unit and to output the level-changed DC voltage, and a controller to control the converter unit,
   wherein, when shading occurs in some of the plurality of solar cells, the power conversion unit supplies a second current, a level of which is lower than a level of a first current that was supplied before the shading occurs,
   wherein the power conversion unit further includes:
      an input voltage detector to detect an input voltage at opposite ends of the capacitor unit; and
      the controller configured to supply the first current, and
   wherein when a voltage variation rate of the input voltage detected by the input voltage detector is a predetermined value or more, the controller determines that the shading occurs, and supplies the second current.

16. The photovoltaic module according to claim 15, wherein the power conversion unit further includes:
   an input current detector to detect an input current flowing to the capacitor unit, and
   wherein the controller determines whether or not shading occurs in some of the plurality of solar cells based on the input current detected by the input current detector, and when determining the occurrence of the shading, performs a control operation to supply the second current, the level of which is lower than the level of the first current that was supplied before the shading occurs.

17. A photovoltaic module comprising:
   a solar cell module including a plurality of solar cells, a first conductive line connected to a first solar cell among the plurality of solar cells, and a second conductive line connected to a second solar cell among the plurality of solar cells; and
   a junction box attached to a back surface of the solar cell module,
   wherein the junction box includes a power conversion unit, which includes a capacitor unit located between the first conductive line and the second conductive line, a converter unit to change a level of a DC voltage at opposite ends of the capacitor unit and to output the level-changed DC voltage, an inverter unit to convert the level-changed DC voltage into an AC voltage and to output the AC voltage, and a controller to control the converter unit and the inverter unit,
   wherein, when shading occurs in some of the plurality of solar cells, the power conversion unit supplies second current, a level of which is lower than a level of first current that was supplied before the shading occurs,
   wherein the power conversion unit further includes:
      an input voltage detector to detect an input voltage at opposite ends of the capacitor unit; and
      the controller configured to supply the first current, and
   wherein, when a voltage variation rate of the input voltage detected by the input voltage detector is a predetermined value or more, the controller determines that the shading occurs, and supplies the second current.

18. The photovoltaic module according to claim 17, wherein the power conversion unit further includes:
   an input current detector to detect an input current flowing to the capacitor unit, and
   wherein the controller determines whether or not shading occurs in some of the plurality of solar cells based on the input current detected by the input current detector, and when determining the occurrence of the shading, performs a control operation to supply the second current, the level of which is lower than the level of the first current that was supplied before the shading occurs.

* * * * *